United States Patent [19]

Fujiwara et al.

[11] 3,909,319

[45] Sept. 30, 1975

[54] PLANAR STRUCTURE SEMICONDUCTOR DEVICE AND METHOD OF MAKING THE SAME

[76] Inventors: Shohei Fujiwara, Takatsuki; Susumu Koike, Fujiidera, both of Japan

[22] Filed: July 25, 1973

[21] Appl. No.: 382,408

Related U.S. Application Data

[62] Division of Ser. No. 226,613, Feb. 15, 1972, abandoned.

[30] Foreign Application Priority Data

Feb. 23, 1971 Japan .................................. 46-8794
Feb. 23, 1971 Japan .................................. 46-8795

[52] U.S. Cl. .................. 148/187; 148/1.5; 148/188; 29/578

[51] Int. Cl.[2] .............................................. H01l 7/44

[58] Field of Search ....... 148/187, 188, 1.5; 29/571, 29/578; 317/235 R, 234, 2; 204/15; 117/217

[56] References Cited

UNITED STATES PATENTS

| | | | |
|---|---|---|---|
| 3,324,357 | 6/1967 | Hill | 317/234 R |
| 3,351,825 | 11/1967 | Vidas | 317/234 R |
| 3,423,821 | 1/1969 | Nishimura | 29/571 |
| 3,591,838 | 7/1971 | Fujiwara et al. | 317/234 R |
| 3,617,820 | 11/1971 | Herzog | 317/234 |
| 3,629,018 | 12/1971 | Henderson et al. | 148/187 |
| 3,634,202 | 1/1971 | Michelet et al. | 204/15 |
| 3,640,782 | 2/1972 | Brown et al. | 148/187 |
| 3,667,008 | 5/1972 | Katnack | 317/235 R |

OTHER PUBLICATIONS

Marinace, J.; Diffusion of Zn Through Films of Refractory Metals on GaAs, In J. Electrochem. Soc., 117, 1970, pp. 145–146.

*Primary Examiner*—Walter R. Satterfield

[57] ABSTRACT

In forming a junction in an energy converting diode by diffusing an impurity such as Zn into a III – V compound crystal such as GaAs, a junction region doped with an impurity such as Zn can be formed directly beneath a thin metal film by forming a thin layer of refractory metal such as Ta on a surface of said crystal, sealing this structure in a reaction tube together with an impurity source such as $ZnAs_2$, and heating the tube within a heating furnace to perform diffusion treatment. In such a formed device, said metal film formed on the surface of the junction region is not lost by the diffusion treatment and remains completely. Further, the remaining metal film makes a good and strong ohmic contact with the matrix crystal, therefore it can be utilized as an electrode and also as a heat dissipating medium by adhering a heat dissipator thereon to form a good heat dissipating device. When part of said refractory metal film is oxidized by anodization, this oxidized film can work as a mask for impurity diffusion and enables selective diffusion of the junction region.

6 Claims, 2 Drawing Figures

PLANAR STRUCTURE SEMICONDUCTOR DEVICE AND METHOD OF MAKING THE SAME

Figure 1:
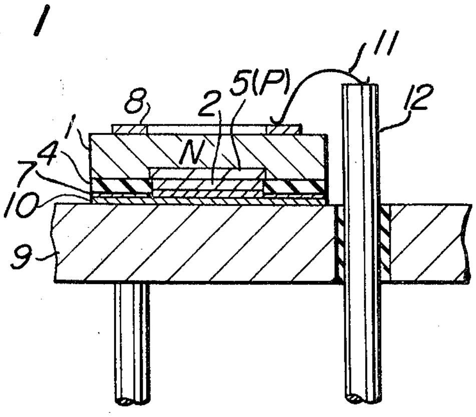

This is a division of application Ser. No. 226,613 filed Feb. 15, 1972, and now abandoned.

This invention relates to energy converter devices such as microwave generating diodes or light-emitting diodes, and more particularly to a high output semiconductor device having a junction region formed by impurity diffusion through a thin film of refractory metal provided on the semiconductor substrate and a method of making the same.

It is well known that when a reverse electric field above the breakdown voltage of a pn junction of certain kind is applied thereto, microwave generation is caused by rapid avalanche phenomenon and junction diodes of such a kind are called IMPATT-diodes.

It is also well known that when a forward current is allowed to flow through a pn junction of a semiconductor of large forbidden band gap and high electron mobility, light-emitting phenomenon of the near infrared to visible region can be observed. These are called light-emitting diodes and are now under development for practical use as indicating means.

For the energy converting solid state device such as IMPATT-diodes or light-emitting diodes as described above, properties of III – V compounds are very suited and thus attracted special attention in such field. Thus, crystals of GaAS, GaP, $GaAs_{(1-x)}P_x$, $Ga_{(1-x)}Al_xAs$, etc. are now under development.

Conventional energy converting devices using such III – V compound crystals, however, are accompanied with various problems which are to be solved shortly:

First, such converter devices are accompanied with relatively large power loss, and the effective dissipation of heat generated due to this power loss is a large problem for realizing high output devices.

Second, as the diffusion preventing maskant in the step of diffusing impurity into the crystal, insulator films used in the case of silicon and/or germanium, such as $SiO_2$ or $Si_3N_4$, have a coefficient of expansion largely different from those of III – V compounds forming the substrate. This will cause unfavorable abnormal diffusion near the interface. Thus, good junction regions are rarely formed by the selective diffusion techniques employed in the manufacture of conventional planar semiconductor devices.

Third, formation of metal electrodes making ohmic contact with a III – V group compound substrate is very difficult. For example, on a p type substrate it is necessary to form an alloyed film of Au containing a minute quantity of Zn or Cd on the substrate surface and then to subject the structure to an appropriate heat treatment. However, said Au alloy itself is of a low melting point and often forms a ternary alloy of Ga, As and Au which may corrode or weaken the substrate surface and decrease the adhesion strength. So, the manufacturing conditions must be carefully controlled.

On the other hand, as for Zn diffusion into GaAs crystals and the contact with said diffused region, it is known by J. C. Marinace, Journal of the Electrochemical Society, Vol. 117, No. 1, pp. 145 to 146 (January, 1970) that when a film of refractory metal such as W, Mo or Cr is formed on a crystalline substrate and when Zn is diffused through this film, there are formed regions in the substrate having a Zn concentration not lower than about $2 \times 10^{20}$ and hence low resistivity and forming substantially good ohmic contacts and he suggests that Mo and Cr films show similar behavior. But, J. C. Marinace only teaches ohmic contact and Zn diffusion through refractory metal films in this paper and does not give answers to said first and second problems in the energy converting semiconductor devices.

This invention intends to solve the various problems in the energy converting semiconductor devices.

An object of this invention is to provide a high output semiconductor device having a structure adapted for very effectively dissipating heat generated at the junction portion due to power loss.

Another object of this invention is to establish techniques for manufacturing planar structure semiconductor device of III – V compound, etc. by introducing simple manufacturing techniques.

Further object of this invention is to provide a solid state device having such a structure that formation of an ohmic contact on a junction region is easy and the junction region can be easily adhered with metallic heat dissipator.

According to the gist of this invention there is provided a semiconductor device of planar structure comprising a semiconductor wafer, a film of refractory metal formed on a portion of a semiconductor water surface, a diffused region having an opposite conductivity type to that of the wafer and formed directly beneath said refractory metal film, and an oxide film of said refractory metal formed on the other surface portion of said wafer surrounding the diffused region. According to the gist of this invention there is also provided a method of making a semiconductor device of planar structure comprising the steps of forming a refractory metal film on a surface of a semiconductor crystal wafer of a III – V group compound, forming a resist film on a portion of said film of refractory metal and converting said refractory metal film into an oxide film of said refractory metal by anodization leaving the portion under said resist film not diffused, and after removing said resist film diffusing a predetermined impurity through said film of refractory metal to form a region of high concentration of said impurity directly beneath said refractory metal film. In such a semiconductor device, said refractory metal film can be directly used as an electrode making ohmic contact with said diffused region and is adapted to be adhered to a heat dissipator through appropriate soft metal solder to improve the heat dissipation efficiency for adapting to a high output device.

Figure 2:
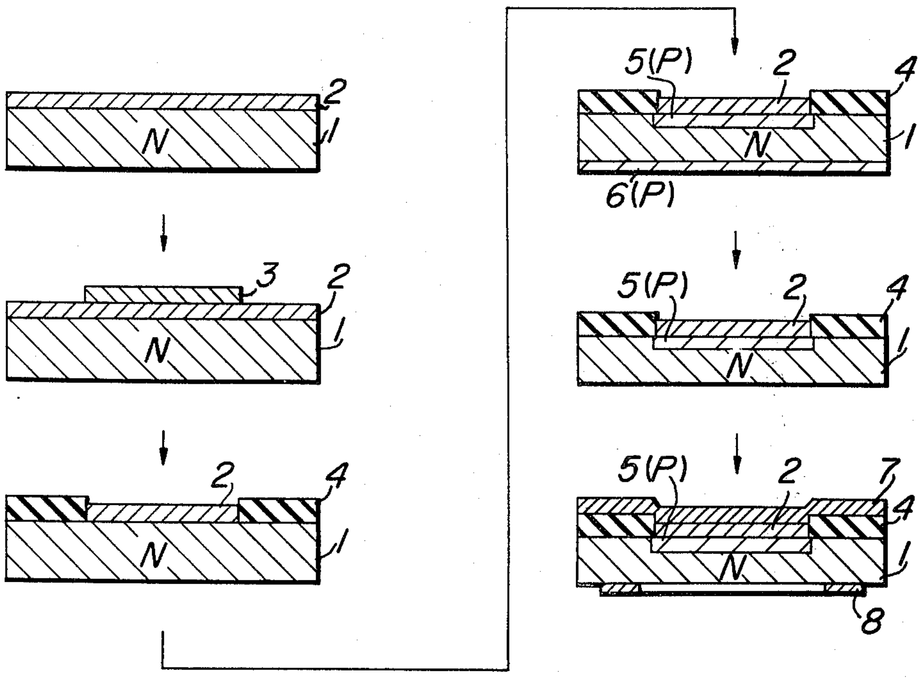

Now, description will be made on the preferred embodiments in connection with the accompanying drawings, in which:

FIG. 1 is a cross section of main part of an embodiment of diode according to the invention; and FIG. 2 is a flow chart of manufacturing steps of a diode according to an embodiment of the invention.

This invention is adapted for a light-emitting diode of GaAs crystal. In FIG. 1, on a surface of an n type GaAs crystal substrate 1 a film of refractory metal 2, in this embodiment one made of tantalum Ta, is provided. Under the film 2, a p type junction region 5 containing a high concentration of Zn is formed. On the other part of the surface of said substrate 1 than that covered with said film 2, a tantalum oxide film ($Ta_2O_5$) 4 is provided. In this light-emitting diode element, said tantalum film 2 serves as one electrode. A film of gold-chromium alloy 7 (preferably containing chromium by 3 to 13%)

is provided extending on said film 2 and said tantalum oxide film 4. The surface of said gold-chromium alloy film 7 is fitted on a heat dissipator, so called stem 9, and adhered thereto with a soft metal solder (usual Sn-Pb eutectic solder) 10. On the other surface of the substrate 1, a metal film such as an evaporation film of gold-germanium alloy 8 is formed to make an ohmic contact with the substrate 1 and is connected with a stem lead wire 12 through a lead wire 11 to finally form a light-emitting diode.

FIG. 2 is a flow chart of manufacturing steps in manufacturing said GaAs light-emitting diode according to the invention; the steps will be described in the order of manufacture.

First, a tantalum film 2 of a thickness of about 1,000 A is deposited on the surface of an n type GaAs crystal substrate 1 doped with about $3 \times 10^{17}$ $cm^{-3}$ of tellurium, Te, by the known d.c. sputtering method. Then, setting a resist film 3 covering an area corresponding to the diffusion window on said tantalum film 2, this specimen is immersed in a mixture solution consisting of one part of oxalic acid, three part of ethylene glycol, and two part of water and subjected to anodization using the GaAs crystal as anode and a carbon plate disposed in reaction tub as cathode. In this anodization, the reaction voltage is gradually raised at a rate of about 1 V/min. and the tantalum film 2 other than the portion under said resist film is transformed into an oxide, $Ta_2O_3$. The rate of transformation that metallic tantalum changes to insulating $Ta_2O_5$ by said anodization (so called anode oxidation) was about 7.6 A/V under said condition of voltage application. After said anodization process, said resist film 3 is removed. This specimen is vacuum-sealed in a quartz ampoule with $ZnAs_2$ serving as an impurity source and heat-treated at about 700°C for 5 hours so as to diffuse zinc in the n type GaAs crystal just under said tantalum film 2 and in the exposed portion to form p type region of high impurity concentration. Although the effective thickness region of tantalum is 500 to 300 A, even a tantalum film of 3,000 A hardly shows a masking effect in the step of zinc diffusion. A zinc doped region 5 of about 5 $\mu$ under the tantalum film formed by diffusion treatment and another zinc doped region 6 formed in the exposed portion of said crystal have a diffusion depth almost of the same order. On the other hand, in the portion covered with the $Ta_2O_5$ film 4 zinc is not introduced at all by the masking effect of $Ta_2O_5$. Thus, semiconductor devices of planar structure can be formed by the above method. Further, a good ohmic contact is formed between said zinc doped region 5 and said tantalum film 2.

Next, the zinc doped region 6 formed in the exposed region of the crystal during said diffusion is removed by chemical etching. Then, there are formed by usual evaporation techniques a film of gold-chromium alloy containing 3 to 15 % of chromium 7 on the tantalum film 2 and a film of gold-germanium alloy containing about 5 % of germanium on the opposite crystal surface of GaAs, both in the thickness region of 5,000 to 10,000 A. These alloy films 7 and 8 form electrodes making ohmic contact with both regions of the junction, and also the film 7 adheres strongly to the tantalum metal film 2 and the tantalum oxide film 4 and the film 8 adheres strongly to the n type GaAs crystal 1. Further, since this embodiment is a light-emitting diode, the configuration thereof may be appropriately arranged to effectively derive light rays emitted near the junction to outside, such as forming the electrode 8 on the GaAs crystal to sorround the emissive region or dividing it partially or appropriately. The gold-chromium alloy film 7 forming one electrode wets well with Sn-Pb eutectic solder so that it can be adhered to a heat dissipator 9 mainly composed of copper 9 strongly and maintaining high conductivity.

In thus formed light-emitting diodes, the surfaces of the metallic electrodes, i.e. those of said tantalum film 2 and said gold-chromium alloy film 7, form optical reflection surfaces, therefore external emission efficiency (or apparent emission efficiency) is increased.

Although GaAs crystal is used in the above embodiments, this invention can also be adapted to other III – V group compounds such as GaP, $GaAs_{(1-x)}P_x$, $Ga_{(1-x)}Al_xAs$ or $Ga_{(1-x)}Al_xP$ ($0 < x < 1$ for any compound) or semiconductors other than III – V group compounds. Further, it is also possible that after forming a P type layer on an n type substrate by the known liquid phase epitaxial method $p^+$ type region (carrier concentration not lower than $1 \times 10^{19}$ $cm^{-3}$) can be formed thereon to form a good ohmic contact with said p type layer according to the above method.

Further, as the refractory metal, niobium, titanium, zirconium, and hafnium can also be used as well as tantalum. These metals have almost no masking effect against zinc and cadmium which are used as impurity, and have similar properties as tantalum. Further, oxides of these metals formed by anodization have effective masking function against impurity diffusion, and are extremely effective and stable as a junction passivating film in a planar structure.

As is clearly described in detail above, the device and the method of making the same according to this invention can sufficiently achieve aformentioned objects and the respective techniques adopted in the manufacture are an integration of widely used techniques familiar in this field and can be extremely easily performed.

Thus, this invention is very useful in microwave generating IMPATT-diodes and light-emitting diodes, and more particularly in the design of high output devices.

What we claim is:

1. A method of making a semiconductor device of planar structure comprising the steps of:

a. depositing a film of at least one refractory metal selected from the group consisting of tantalum, niobium, titanium, zirconium and hafnium on one main surface of an n-type III – V group compound semiconductor wafer to a thickness in the range of 500 to 3,000 A by sputtering;

b. adhering a resist film on a predetermined portion of said refractory metal film;

c. immersing the n-type semiconductor wafer in a reaction liquid consisting of oxalic acid, ethylene glycol and water to convert said refractory metal film into an oxide film of said refractory metal by means of anodization while leaving the portion directly beneath the resist film not converted;

d. removing said resist film through chemical etching: and e. heating the n-type semiconductor wafer in a sealed tube in the presence of a p-type predetermined impurity selected from the group consisting of zinc and cadmium to diffuse said impurity through said refractory metal film to form a p-type region of high concentration of said impurity directly beneath said refractory metal film.

2. A method of making a semiconductor device of planar structure comprising the steps of:

a. depositing a tantalum film 3,000 A thick on one main surface of an n-type GaAs crystal wafer doped with about $3 \times 10^{17}$ $cm^{-3}$ of tellurium by d.c. sputtering:

b. adhering a resist film covering an area corresponding to a diffusion window on the tantalum film;

c. immersing the GaAs crystal wafer in a mixture solution consisting of one part of oxalic acid, three part of ethylene glycol and two part of water and applying anodization to the n-type GaAs crystal wafer using the GaAs crystal wafer as an anode and a carbon plate disposed in a reaction tube as a cathode in order to transform the tantalum film other than the portion directly under said resist film into $Ta_2O_5$, the reaction voltage employed in the anodization being gradually raised at a rate of about 1 V/min.;

d. removing said resist film through chemical etching;

e. vacuum-sealing the GaAs crystal wafer in a quartz ampoule with $ZnAs_2$ serving as an impurity source, and thereafter heating it at about 700°C for 5 hours so as to diffuse zinc in the one main surface of the n-type GaAs crystal wafer just under said tantalum film and in the other exposed main surface thereof to form p-type regions of high impurity concentration each about 5$\mu$ thick;

f. chemical etching the p-type zinc diffused region formed in the other main surface of the GaAs crystal wafer;

g. vacuum-depositing a gold-chromium film containing 3 to 15 % of chromium, and gold-germanium alloy film containing about 5 % of germanium, on both the tantalum film and the $Ta_2O_5$ film and on the other main surface of the GaAs crystal wafer, respectively.

3. A method of making a semiconductor device of planar structure comprising the steps of:

a. depositing a film of at least one refractory metal selected from the group consisting of tantalum, niobium, titanium, zirconium and hafnium one one main surface of an n-type III – V group compound semiconductor wafer to a thickness in the range of 500 to 3,000 A by sputtering:

b. adhering a resist film on a predetermined portion of said refractory metal film;

c. immersing the n-type semiconductor wafer in a reaction liquid to convert said refractory metal film into an oxide film of said refractory metal by means of anodization while leaving the portion directly beneath the resist film not converted;

d. removing said resist film through chemical etching; and e. heating the n-type semiconductor wafer in the presence of a p-type predetermined impurity to diffuse said impurity through said refractory metal film to form a p-type region of high concentration of said impurity directly beneath said refractory metal film.

4. A method of making a semiconductor device of planar structure according to claim 3, wherein said impurity is a material selected from the group consisting of zinc and cadmium.

5. A method of making a semiconductor device of planar structure according to claim 3, wherein step (e) is followed by the further step of coating a gold-chromium film on said refractory metal and said oxide film of the refractory metal over said one main surface of the n-type semiconductor wafer.

6. A method of making a semiconductor device of planar structure according to claim 5, wherein step (e) is also followed by the step of coating a gold-germanium alloy film on the other surface of the n-type semiconductor wafer.

* * * * *

UNITED STATES PATENT AND TRADEMARK OFFICE

CERTIFICATE OF CORRECTION

PATENT NO. : 3,909,319

DATED : September 30, 1975

INVENTOR(S) : Shohei Fujiwara; Susumu Koike

It is certified that error appears in the above-identified patent and that said Letters Patent are hereby corrected as shown below:

On the cover sheet "[76]" should read-- [75]--; and immediately below the Inventors' names should be added -- [73] Assignee: Matsushita Electronics Corporation, Osaka, Japan--.

Signed and Sealed this tenth Day of February 1976

[SEAL]

Attest:

RUTH C. MASON
*Attesting Officer*

C. MARSHALL DANN
*Commissioner of Patents and Trademarks*